US008657958B2

(12) United States Patent
Revankar et al.

(10) Patent No.: US 8,657,958 B2
(45) Date of Patent: Feb. 25, 2014

(54) CVD-SIEMENS MONOSILANE REACTOR PROCESS WITH COMPLETE UTILIZATION OF FEED GASES AND TOTAL RECYCLE

(75) Inventors: Vithal Revankar, Houston, TX (US); Sanjeev Lahoti, Houston, TX (US)

(73) Assignee: Savi Research, Inc., Houston, TX (US)

( * ) Notice: Subject to any disclaimer, the term of this patent is extended or adjusted under 35 U.S.C. 154(b) by 748 days.

(21) Appl. No.: 12/874,873

(22) Filed: Sep. 2, 2010

(65) Prior Publication Data

US 2012/0058022 A1 Mar. 8, 2012

(51) Int. Cl.
*C23C 16/442* (2006.01)
*C23F 1/00* (2006.01)
*H01L 21/306* (2006.01)
*C23C 16/06* (2006.01)

(52) U.S. Cl.
USPC ............... 118/715; 118/724; 156/345.29

(58) Field of Classification Search
USPC ............... 118/715, 724; 156/345.29
See application file for complete search history.

(56) References Cited

U.S. PATENT DOCUMENTS

| 4,950,373 | A * | 8/1990 | Sundermeyer et al. ........ 204/164 |
| 6,530,980 | B2 * | 3/2003 | Abe et al. ............................. 96/4 |
| 2004/0187683 | A1 * | 9/2004 | Wang et al. ..................... 95/114 |
| 2009/0238972 | A1 * | 9/2009 | Clark et al. .............. 427/255.28 |
| 2011/0011129 | A1 * | 1/2011 | Briend et al. ................... 62/617 |
| 2011/0206842 | A1 * | 8/2011 | Revankar et al. .......... 427/248.1 |
| 2012/0058022 | A1 * | 3/2012 | Revankar et al. ............. 422/187 |

FOREIGN PATENT DOCUMENTS

WO WO 2009112730 A2 * 9/2009

* cited by examiner

*Primary Examiner* — Rudy Zervigon
(74) *Attorney, Agent, or Firm* — Baker & McKenzie LLP

(57) ABSTRACT

The present invention relates to a monosilane ($SiH_4$) and hydrogen recycle process/system for chemical vapor deposition (CVD) of monosilane-based CVD polysilicon. In particular, the present invention relates to the substantially complete silane utilization and unconverted (from the reactor) contamination-free complete silane and hydrogen recycle process of producing polysilicon chunk materials via the decomposition of gaseous silane precursors.

11 Claims, 3 Drawing Sheets

Reactor Complete Silane Recycle Scheme

Reactor Complete Silane Recycle Scheme

Reactor Heater Medium Recycle Scheme

Reactor Nitrogen Recycle Scheme

CVD-SIEMENS MONOSILANE REACTOR PROCESS WITH COMPLETE UTILIZATION OF FEED GASES AND TOTAL RECYCLE

FIELD OF THE INVENTION

The present invention relates to a monosilane ($SiH_4$) and hydrogen recycle process/system for chemical vapor deposition (CVD) of monosilane based CVD polysilicon. In particular, the present invention relates to the substantially complete silane utilization and unconverted (from the reactor) contamination free complete silane and hydrogen recycle process of producing polysilicon chunk materials via the decomposition of gaseous silane precursors.

BACKGROUND OF THE INVENTION

The production of polysilicon chunk materials via the decomposition of a gaseous precursor compound on a slim rod substrate is a well-known, widely used process commonly referred to as the "Siemens process." In a typical Siemens process, high-purity silicon rods are exposed to trichlorosilane at 1150° C. with a carrier gas. The trichlorosilane gas decomposes and deposits—silicon onto the heated rods, growing them:

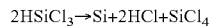

Silicon harvested from this and similar processes is the polycrystalline silicon. Polycrystalline silicon grown by Siemens process typically has impurity levels of less than 10-9.

In more detail, the Siemens process is a combined decomposition/deposition process that comprises: (1) heating one or more rods or filaments (appropriate substrates) covered by a suitable enclosure to allow high temperature, air-tight operation; (2) feeding a precursor material or compound of desired composition (containing silicon) with no or minimal contamination; (3) further heating the enclosed rods or filaments to a desired temperature under an appropriate environment; (4) decomposing the precursor material preferentially on the heated surface of the rods/filaments to form chunk polysilicon on the substrate or the slim rod; (5) recovering or disposing of byproducts; and (6) recovering the polycrystalline silicon grown slim rods without contaminating them.

In typical Siemens processes and reactors, the reactant gas is fed to the rods from a single port resulting in uneven growth. Such uneven gas distribution over the length of the rod further promotes heavy homogeneous nucleation creating dust. Such uneven growth and homogeneous nucleation promote eventual reactor failure/shut-down. Moreover, the rods within typical Siemens process reactors are not individually isolated. As a result, homogeneous nucleation, lower conversion, higher by-products, and uneven growth on the rods is further promoted by uneven radiant heat between the rods and gas precursor distribution.

Known systems utilizing the Siemens process use at least two power supplies hooked to each reactor system. One or more primary power supply is used for heating and maintaining the temperature of the reactor slim rod (i.e., the rods on which the chuck silicon material is deposited) system for gas decomposition/deposition. A secondary power supply is generally necessary at initiation of heating to overcome the electrical resistance of the silicon rod (greater than about 26,000 volts is needed for a typical for the reactor and also the voltage needed is dependent on the length and diameter of the slim rod assembly used). The necessity for a high voltage power supply significantly increases the cost and safety concerns of operating such known reactors.

Rather than use a very high voltage source, some known reactors use a heating finger introduced into the reaction space and parallel to the deposition rods. To preheat the reactor slim rods for deposition, the heating finger is lowered into the reaction space in the proximity of the slim rods mounted in the reactor. Once the slim rods are at the optimum electrically conductive condition with temperature, the electrical current can be passed through the carrier rods. Then the heating fingers are removed from the reactor and the opening in the metallic enclosure is sealed. Such known reactors present further issues with the purity/integrity of the product, throughput, and establishing and maintaining a seal as well as safety, operational and maintenance issues.

According to known common industrial processes, elemental silicon is obtained in the Siemens type reactor, in the form of cylindrical rods of high purity by decomposing silicon halides from the gas phase at a hot surface of the pure and purified silicon filament, the preferred halides being the chlorides, silicon tetrachloride and trichlorosilane. These compounds become increasingly unstable at temperatures above 800° C. and decompose.

Homogeneous and heterogeneous nucleation processes compete with each other in the reactor. Silicon deposition starts at about 800° C. via heterogeneous reaction and this deposition extends to the melting point of silicon at 1420° C. Since the deposition is beneficial only on the slim rods, the inner walls of the decomposition chamber must not reach temperatures near 800° C. in order to prevent wasteful deposition on the chamber walls.

In known Siemens process reactors, the reactor walls are generally cooled to prevent such wasteful deposition and also to maintain the structural integrity of the assembly. However, cooling the walls consumes additional energy. A further issue with the cooling of the reactor walls is the thermophoretic deposition of powder particles on the cooled reactor walls. Such deposition is generally weak resulting in the multiple re-circulation of the particles in the gas stream. This deposited powder eventually loosens and collapses into the reactor, causing premature failure of the reactor.

The silicon halides used most frequently for the preparation of high purity silicon are silicon tetrachloride and trichlorosilane. These halides will undergo pyrolysis when in contact with hot surfaces and deposit elemental silicon. To obtain reasonable and economical yields, however, an excess of hydrogen gas is added to the silicon halide vapor reaction feed gas. Because of its proportionally higher silicon content per unit weight and comparatively lower deposition temperature (i.e., faster kinetics), trichlorosilane will deposit more silicon than silicon tetrachloride and is therefore the preferred material for the Siemens' process for the preparation of polycrystalline silicon using silicon halide process. However, other silane based precursors can be used in the reaction.

For example, silicon halides with less than three chlorine atoms, such as $SiH_2Cl_2$ and $SiH_3Cl$, in particular, deposit much more silicon per mole of silicon halide consumed in the reaction. However, these silicon precursors are not practical because they are not readily available and thus less desirable economically. Also, the yield is not more than 20% (±2%) per each pass through the reactor and the by-product gases are very difficult to handle.

Another approach to improved deposition rates is by using monosilane (aka $SiH_4$ or silane) as the precursor silicon source. The process uses heated mixtures of silane and hydrogen where fast kinetics and lower temperatures assist faster deposition and better conversion than the chlorosilane process. For example, silane offers itself as an effective silicon precursor and, having no chlorine in the molecule, also improves the silicon to hydrogen ratios of silicon reaction gas mixtures. Typically, silane decomposes above 300° C., and more readily above 400° C. forming silicon and hydrogen. That is, the silane decomposition process occurs at much lower temperature than the trichlorosilane decomposition process. Unlike chlorosilane process, the byproducts formed are silane and hydrogen which may be readily recycled.

Typically, the off-gas stream from the monosilane based Siemens reactor contains homogeneously formed polysilicon reaction dust, unconverted reactant gas, by-product gases formed in-situ (disilane, organosilanes etc.) and other impurities present in the reactor and feed gases. Thus, the hydrogen and recovered monosilane streams if re-circulated directly back to the reactor may contaminate the CVD polysilicon process/product and therefore, cannot be reused in the prior art processes. The loss of monosilane and hydrogen in the monosilane based Siemens systems is a further economic drain on the production of polycrystalline silicon due to the raw material loss. Therefore, a system for recovery, purifying and recycling monosilane and hydrogen gas would be very desirable.

What is needed in the art therefore, is an improved Siemens type process for making polysilicon by deposition that recycles silane and/or hydrogen and allows for total utilization of monosilane, and yet produces extremely pure polysilicon in a cost effective and efficient way.

BRIEF SUMMARY OF THE INVENTION

Generally speaking the invention is directed to CVD-Siemens reactor or system improvements comprising an unreacted silane and hydrogen recovery and recycle system.

More particularly, the improvements comprise cooling and purifying silane through a series of filters, molecular sieves, absorption columns and/or fractional distillation columns and recycling it back into the system. Similarly, hydrogen is cooled, purified and recycled. In preferred embodiment, a countercurrent heat exchanger is used to further improve the cost effectiveness of the system.

Off gases (containing hot unreacted silane, hydrogen and various impurities) from the reactor are typically around 260-280° C., and are cooled (~150-200° C.) and filtered, preferably using sintered stainless steel filter elements. The off gas is further cooled (to about room temperature (20-30° C.) and compressed to the required CVD recycle system pressure so that it can be recycled back into the system after purification. Preferably, the compressor is a two-stage, non-lubricated, balanced-opposed, reciprocating compressor. Single staged compressor can be used based on operational requirement.

The unreacted silane, hydrogen and impurity stream from the compressor is further cooled (−150° C. to −180° C.) by passing through heat interchangers, preferably using the cold hydrogen stream (obtained at another point in the system and discussed below) as the cooling medium. This countercurrent heat exchange system saves energy and improves the cost effectiveness of the recycle process.

Hydrogen, if any, can optionally be removed at this point by any vapor-liquid separator, such as flash drum, knock-out drum, knock-out pot, compressor suction drum or compressor inlet drum. If so, the separated silane is then vaporized and recompressed for further purification.

The silane plus impurities are then further cooled to reach the condensation temperature of the off gas components (−170° C. to −180° C.), preferably in a liquid nitrogen cooled exchanger although other cooling systems can be used. At such temperatures, most (at least about 95%) of the silane (including impurities) in the gas stream is condensed.

The condensed silane plus impurities stream may then be sent for further purification, but can be re-circulated back to the reactor at this point if the purity of the polysilicon is not critical.

If further purification is needed, the condensed silane is passed through a series of fractional distillation columns, to separate the various components. For example, we have used a degasser column to remove the light gases, including hydrogen, other lighter gases (lighter than silane) and small molecular weight hydrocarbon impurities. The silane and heavy contaminant components are collected from the bottom as liquid and pass through the heavy column where heavy components are removed from the column bottoms. Top exit silane gas, if any, is passed through a series of adsorber beds to remove the ethylene and other hydrocarbons before passing through a final finishing column. The liquid silane then passes through a heavy component purification column, which separates heavy components out the bottom and silane vapor out the top.

To remove ethylene, silane vapor is passed through columns containing 4 Å molecular sieves. Ethylene is thus adsorbed in the pores of the molecular sieves. To prevent a possible breakthrough of hydrocarbons, three or more molecular sieve columns are preferably placed in series and the stream between the first two columns is monitored for hydrocarbons.

Silane from these adsorption columns can again be filtered, and then to a final finishing column or polishing column, distills the ethylsilane away from the now pure silane. This pure silane can be stored as liquid and then heated and recycled, or can be recycled immediately.

We have described a particular series of purification procedures, and the heating and cooling needed to use each, but obviously the order and exact details of the purification steps used can vary.

Hydrogen must be separated from the silane at one or more points in the process, preferably at the degasser column, but majority of it can be separated at other points, such as a vapor-liquid separator at any appropriate point in the process. If hydrogen is separated at more than one point, these streams can be recombined before further treatment.

The separated hydrogen is passed through one or more purification columns at very low temperatures, preferably, in activated carbon beds and preferably in activated charcoal beds that are placed in series. If needed the purified, low temperature hydrogen, is passed through a cryogenic filter to trap any particulates that may have escaped from the adsorption beds. Preferably, this hydrogen stream is cooled with liquid nitrogen to very cold temperatures and thus this hydrogen steam can be used as a countercoolant for the hot off gas stream.

This very cold hydrogen stream is then heated to about room temperature, preferably by passing the hydrogen stream through the previously discussed heat interchanger, before being recycled. Thus, the cold hydrogen cools the hot gases exiting the CVD reactor, and cost effectiveness of the system is greatly increased.

DETAILED DESCRIPTION OF EMBODIMENTS OF THE INVENTION

Figure 1:
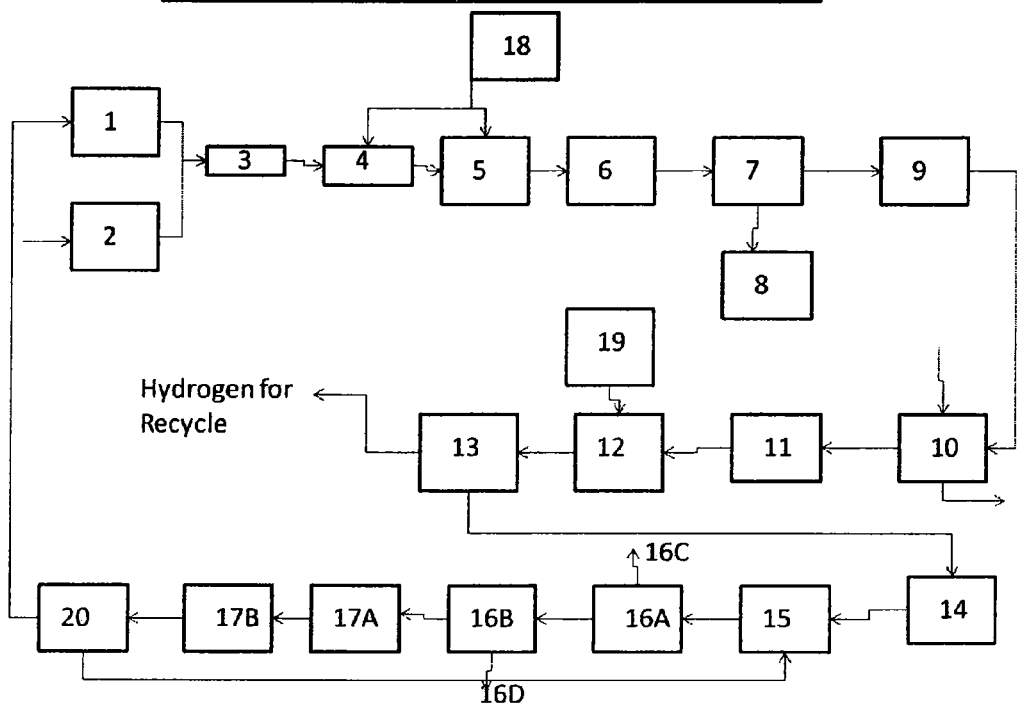
FIG. 1 is a schematic depicting an embodiment of the inventive chemical vapor deposition system with silane and hydrogen recycle.

Embodiments of the invention provide a silicon rod production apparatus, having: a reactor vessel containing at least one reaction chamber surrounded each rod by a jacket, wherein a pre-heating and heat removal fluid is circulated in the jacket; one or more electrode assemblies extending into the reaction chamber wherein each electrode assembly comprises a heating transfer jacket, one or more gas inlets, one or more heat transfer fluid inlets/outlets, at least one pair of silicon filaments, the filaments connected to each other at their upper ends with a silicon bridge to form a filament/slim rod assembly, each filament/slim rod assembly enclosed in an isolation heat transfer fluid jacket; a source of a silicon-bearing gas distributed at various points via nozzles to the interior of the vessel for supplying the gas into the reaction chamber to produce a reaction and to deposit polycrystalline silicon on the filament by chemical vapor deposition thereby producing a rod of polycrystalline silicon; a heat transfer fluid system that is connected to the jacketed reaction chamber that supplies heat transfer fluid to preheat the deposition slim rods (onto which chunk silicon will be deposited), and to maintain the jacket wall temperature and act as a cooling medium to remove excess transferred heat and a power supply wherein the power supply provided significantly less than about 26,000 volts; wherein the apparatus does not include a heating finger.

The reactor has a thick and thermally cooled base plate. The base plate has cavities to facilitate passage of a heat transfer liquid, gas inlet, diluents inlet, electrode inserts and exhaust port. A metal bell-shaped enclosure which is surrounded by an enclosed channel with a jacket containing baffles to facilitate passage of a heat transfer liquid over the outside surface of the bell-shaped enclosure. Thin rods of silicon are mounted in a U-shaped configuration on an electrode and are held in place on the base plate. The electrodes are coupled to electrical connectors which pass through the base plate and are tied to an electric power source.

Additional steps in the inventive process include preheating the rod reaction chamber to a temperature at which the silicon filaments become conductive by circulating a heat transfer fluid in the heat transfer system surrounding the slim rods/silicon filaments; heating the silicon filaments to a silicon deposition temperature by applying an electric current from the power supply; feeding a reactant gas stream to the reaction chamber under pressure; decomposing at least a part of the reactant gas stream to form silicon; and depositing silicon on the silicon filaments to produce a polycrystalline silicon rod.

Off gases from the reactor typically are around 280° C. for the existing reactor and are cooled to a temperature by means of a cooling medium, preferably water cooled exchanger, at which point dust filtration is conducted. This avoids the dust accumulation within the system and gas stream. The cooled gas, laden with the dust is filtered using sintered stainless steel filter elements to capture particles generated via homogeneous nucleation. Thus, the resulting filtered gases are not contaminated with dust and can be further recycled to improve cost effectiveness.

The off gas is further cooled for the compression to the required CVD recycle system pressure to recycle back into the system after purification. The off gas temperature is brought closure to the ambient temperature by means of an exchanger, preferably a water exchanger. The recycle hydrogen compressor is, in preferred embodiments, a two-stage, non-lubricated, balanced-opposed, reciprocating compressor. A non-lubricated reciprocating compressor is preferable in that it will circulate a large volume of gas with essentially no contamination. An ordinarily skilled artisan would understand that any compressor providing such qualities may be used in embodiments of the invention.

A two-stage compressor further limits the discharge temperature of the gas from each stage. Thus, in some embodiments, a maximum gas temperature is set by the temperature limitations of the Teflon rings and rider bands used in the compressor. A lower discharge temperature also favors longer compressor valve life and reliability. The off gas is then compressed to feed gas pressure to overcome the CVD reactor operational pressure drop plus the pressure drop across the whole off-gas handling system. The discharge gas from the compressor is cooled for further purification, recovery and recycle.

The unconverted silane and entire hydrogen stream from the compressor aftercooler is further cooled by passing through interchangers using the cold hydrogen stream from the adsorbers/hydrogen purifier column as the cooling medium (inter gas heat exchange to save energy). The outlet gas is then finally cooled via liquid nitrogen (or other cooling medium) to reach the condensation temperature of the off gas silane gas and its impurity components, preferably in a liquid nitrogen cooled exchanger although other cooling systems can be used. At such temperatures, most (at least about 95%) of the silane (including impurities) in the gas stream is condensed. The condensed silane plus impurities stream may then be sent for purification system after compressing. It can be re-circulated back to the reactor if the purity of the polysilicon is not critical.

The contaminated silane is passed through the degasser column to remove the light gases and hydrocarbon impurities. This takes place under pressure of 22.14 kg/cm$^2$, around $-12$ to $-54°$ C. (top to bottom). The silane and heavy contaminant components are collected from the bottom and pass through the heavy column where heavy components are removed from the column bottoms. The condition of the heavy column typically varied from 38 C to $-54°$ C. under the pressure of around 21.09 kg/cm$^2$. The top exit silane gas is passed through the series of adsorber beds to remove the ethylene and other hydrocarbons before passing through the final finishing column.

The final finishing column has conditions similar to heavy column with slightly lower pressure. The silane coming out now is very pure and stored before recycling to the reactor at around 18.3 kg/cm$^2$ and around $-38$ to $-40°$ C. The silane liquid is then heated to about room temperature by passing through the preheater. A final filtration of the high purity silane gas is achieved in a recycle silane filter (preferably having a pore size of 0.04 microns or less).

The hydrogen stream after separation from silane and corresponding contaminants is separated from the mist [not shown] and passed through one or more purification columns. The purification process is conducted at very low temperatures (at least around $-170$ to $-175°$ C.) especially in the activated carbon bed with activated carbon having surface area greater than 500 m$^2$/g or molecular sieve beds.

Generally, the purification columns, or adsorption beds, through which the hydrogen gas is passed, are operated in series. Impurities in the hydrogen gas, such as argon, carbon compounds (mainly methane), uncondensed silane, boron and phosphorous compounds are retained in the adsorption bed. These beds may be regenerated selectively during which off gases may be flared, or otherwise disposed.

The purified very low temperature hydrogen, is passed through a cryogenic filter (preferably having a pore size 1 micron absolute size), to trap any particulates that may have escaped from the adsorption beds. The hydrogen stream is then heated to about room temperature, preferably by passing the hydrogen stream through the previous hydrogen heat interchanger (thereby exchanging heat with the hot unpurified hydrogen and further improving cost effectiveness). A final filtration of the high purity hydrogen gas is achieved in a recycle hydrogen filter (preferably having a pore size of 0.04 microns or less). Purified hydrogen can then be recycled back into the CVD reactor or otherwise used.

Referring to FIG. 1, the system of one embodiment of the invention is shown in schematic form. For convenience, Table 1 lists names for the components of the system shown in FIG. 1.

TABLE 1

| | |
|---|---|
| 1 | Silane Supply |
| 2 | Hydrogen Supply |
| 3 | Mixing tee |
| 4 | Preheater/exchanger |
| 5 | CVD Reactor |
| 6 | Reactor Outlet gas cooler |
| 7 | Dust Filter |
| 8 | Dust Hopper |
| 9 | Compressor |
| 10 | Recycle hydrogen Interchanger |
| 11 | Recycle Hydrogen Cooler |
| 12 | Condenser |
| 13 | Knock-out Drum |
| 14 | Silane evaporator/exchanger |
| 15 | Silane Compressor |
| 16A. | Silane Degassing |
| 16B. | Silane Heavy Degasser |
| 16C. | Light gases out |
| 16D. | Heavy gases out |
| 17A | Silane Purification |
| 17B | Silane Polishing |
| 18 | Heating medium Supply |
| 19 | Cooling Medium Supply |
| 20 | Silane Storage |

In a typical operation, the silane in the liquid form is supplied from the storage tank [1] via exchanger (gasify). The gaseous silane is mixed with the hydrogen supplied from the system [2] by means of a static mixer [3]. The gaseous silane and hydrogen are heated to the feed temperature between 240° C. and 300° C. (below the silane decomposition temperature) via heat exchanger [4] before feeding into the reactor. The hydrogen dilution may be between about 85% and 99% in silane. The silane reacts in the gas phase adjacent to the heated rod and decomposes into polysilicon in the CVD reactor [5] to produce chunk polysilicon via heterogeneous reaction. Homogeneous reaction may also occur which competes to produce the silicon powder. The typical off gas contains dust, unconverted silane and other impurities, and exits the reactor at temperatures between 260° C. and 280° C.

The unconverted silane off gas and excess hydrogen is further cooled in a preferably water cooled heat exchanger [6] to about 175° C. The off gas, laden with dust, is filtered using sintered stainless steel filter elements [7]. The dust collects on the outside of these elements and is periodically removed by back pulsing the elements with recycle hydrogen. The dust falls from the elements and is collected in a drum [8] via hopper. It can also be collected directly in the super sack in alternative embodiments of the inventive system.

The filtered off gas is further cooled to a temperature closer to typical ambient temperatures, generally between 30° C. and 35° C., in a preferably water cooled heat exchanger (not shown). The heat exchanger may be part of the compressor, which may include a recycle compressor inlet cooler, coarse filter, polishing filter, first stage suction bottle and a first stage discharge bottle. The cooled off gas is then optionally passed through a guard filter (not shown) to the recycle hydrogen/silane compressor [9]. In some embodiments of the invention, the recycle hydrogen compressor [9] is a two-stage, non-lubricated, balanced-opposed, reciprocating compressor.

Recycle hydrogen/silane compressor [9] operation limits the discharge temperature of the gas from each stage to under about 130° C. to 135° C. The gas enters compressor [9] at about 0.42 kg/cm$^2$ and is compressed to about ~2 kg/cm$^2$ in the first stage of compressor [9]. The gas discharged from the first stage of compressor [9] is then cooled from about 120-125° C. to about 30-38° C. using a compressor intercooler (not separately depicted) followed by a final polishing filter which may be part of the hydrogen compressor [9] (not separately shown). A single stage compressor [9] can also be used with appropriate discharge and temperature controls in alternative embodiments of the inventive system.

The unconverted silane and excess hydrogen stream exiting the compressor is then cooled to about −160° C. to −165° C. by passing through heat interchangers [10] using the cold hydrogen stream from the adsorbers [not shown] as the cooling medium (cross flow). The silane-hydrogen stream is further cooled to −170° C. to −180° C., preferably in a liquid nitrogen cooled exchanger [11] and condenser [12]. This will cool and liquefy the silane and any contaminants.

A knockout pot [13] is provided to separate the condensed silane and other condensates (such as impurities) from the hydrogen stream. The separated silane is then vaporized in an air-heated vaporizer [14] and fed to the silane compressor [15] to be re-purified. Recycled silane is routed to the suction of the silane compressors.

The silane compressor [15] is, in certain embodiments, a two-stage reciprocating machine with inlet, outlet and interstage pulsation bottles and an interstage cooler. The compressor [15] may use non-lubricated Teflon rings to avoid the addition of impurities to silane. The first stage of compressor [15] increases the pressure to ~5.27 kg/cm$^2$ and the second stage to 24.61 kg/cm$^2$. The intercooler of compressor [15] lowers the temperature of silane from 113° C. to 40° C. At the outlet of the second stage of compressor [15], a firmed tube air-cooled heat exchanger [not shown] is provided to lower the temperature from 113° C. to about −10° C. before the silane is fed to for purification. A discharge-to-suction recycle line [not shown] around the compressor [15] through a pressure control valve is provided to control the compressor suction pressure at 0.8 kg/cm$^2$.

The contaminated silane is compressed to 24.61 kg/cm$^2$ in compressor [15] and then fed to the degasser column [16A]. Light ends (low molecular weight contaminants) in the contaminated compressed silane are removed in the degasser column [16A]. The degasser column [16A] operates at 22.14 kg/cm$^2$ and has a large stripping section and a small rectification section. Light ends, such as hydrogen, nitrogen and methane, leave column [16A] as an overhead vapor. Silane and the heavy ends leave column [16A] at the bottom as a liquid. The degasser column [16A] is packed with structured packing. Structured packings typically consist of thin corrugated metal plates or gauzes arranged in a way that they force fluids to take complicated paths through the column, thereby creating a large surface area for contact between different phases. Such packings include Ashoka, Sulzer, Koch-Glitsch, Nonkon, Rhine Ruhr Structured Packing and ACS Separations and mass-transfer products.

The condenser on the degasser column [16A] is preferably designed as a dephlegmator in order to avoid external piping and other connections associated with a conventional condenser. Refrigerated heptane at −54° C. is used as a cooling medium on degasser column [16A] overhead condenser to condense silane and reflux back. The reboiler on the degasser column [16A] is a thermosiphon type using heptane at −9 to −12° C. as a heating/cooling fluid. The column boil-up and reflux are controlled by heat input to the reboiler. The overhead draw is small and mostly non-condensable, and therefore the column reflux is almost equal to the boil-up. Column pressure is controlled by release of non-condensables to the flare.

Figure 3:
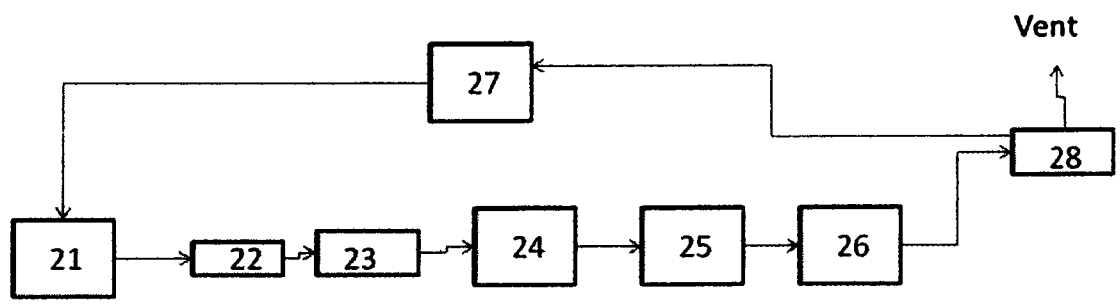
FIG. 3 is a schematic depicting a reactor nitrogen cooling/recycle system useful in some embodiments of the invention.

The overhead vapor leaving the degasser column [16A] overhead condenser is further cooled by a second knock-back condenser to remove as much silane as possible. Preferably liquid nitrogen is used as a coolant on the knock-back condenser (FIG. 3). The light ends leaving the knock-back condenser [16C] are at −115° C. and the nitrogen leaving the shell side is at −120° C. The light ends are discharged into the flare header.

Silane and the heavy ends leave the bottom of the degasser column [16A] as a liquid and flow under pressure to the product column [16B]. This column [16B] operates at 21.09 kg/cm$^2$. Heavy ends such as ethane, ethylsilane, and other heavies are removed from the bottom of column [16B] as a liquid [16D]. Silane, along with ethylene, leaves the silane product column [16B] as an overhead vapor. The silane product column [16B] is a packed with structured packing. It has three packed sections for rectification and one for stripping. The condenser is a conventional type with the overhead vapor draw being taken ahead of the condenser. The liquid reflux overflows back into the column [16B]. Heptane or any other suitable solvent at −54° C. is used as a cooling medium on the condenser. The reboiler is preferably designed as a drum with internal heating coils. Heptane at about 138° C. is used to heat this reboiler which normally contains mostly ethane and ethylsilane. The column pressure is controlled by the cold heptane refrigerant flow to the overhead condenser.

Silane vapor leaving the silane product column [16B] overhead typically contains low amounts (<200 ppm) of ethylene. Ethylene has a volatility of 0.97 with respect to silane and, hence, is difficult to separate by distillation. To remove ethylene, silane vapor is passed through three packed columns [17A] containing 4 Å molecular sieves. Ethylene is thus adsorbed in the pores of the molecular sieves. Since the sieves are capable of removing ethane also, columns [17A] provide insurance against upsets in the silane product column operation.

To prevent a possible breakthrough of hydrocarbons, the molecular sieve columns are preferably placed in series and the stream between the first two columns is monitored for hydrocarbons. When the first sieve bed shows ethylene breakthrough, it is taken off-line and regenerated. On completion of the regeneration, the fresh bed is put on line as the tertiary bed and the cycle repeated.

Silane from the adsorption columns [17A] passes through a porous metal filter where any solids carryover from the molecular sieves as well as other particulate impurities are trapped. The filter has a liquid rating of 0.3 to 0.4 micron. For the vapor, the rating is lower by an order of magnitude (about 0.04 microns). Purified silane from the adsorbers is then routed to the ethylsilane distillation column [17B].

A small distillation column [17B], also called a polishing column, is installed between the adsorbers and the storage tanks to remove the ethylsilane. The column operates at approximately 18.63 kg/cm$^2$. An overhead condenser using refrigerated heptane is used to condense the ethylsilane. Electrical heating strips provide reboiler heat. The column is packed with structural packing.

The ethylsilane distillation column [17B] operation is very similar to the silane product column [16B] operation. Like the silane product column, the bottoms flow is very small relative to column feed. To maintain the material balance in the column and the bottoms level, the overhead product is flow controlled. In the silane product column [16B] this is adjusted manually to gradually build level in the bottoms. In the ethylsilane column, a level control "cascade" loop has been added to automatically make this adjustment. The bottoms composition of heavies will then gradually increase. Varying reflux or heptane refrigerant flow controls the column pressure. The column has been designed to operate at near minimum packing wetting to reduce refrigeration requirements. The reboiler heat input is adjusted based on feed conditions (flow, temperature and pressure) to maintain the desired reflux flow.

Since the column composition is essentially pure silane, the temperature is nearly constant throughout and is not an adequate indicator of column performance. (−40° C. for overheads and −39° C. for bottoms, at 19 kg/cm$^2$). Column misoperation is noted instead by deviation in column bottoms level for loss of material balance and high packing temperature for loss of reflux. Adequate packing wetting and ethylsilane removal is confirmed by product analytical analysis and heat balance calculation. An inline overhead sample point can be added for GC analysis. The bottoms analysis may require manual sampling due to the extremely small flow.

The purified silane is stored in the storage tank [20] via rundown tank (not shown). The run down tank will have its own condenser. Refrigerated heptane at −54° C. is a preferred cooling fluid on these condensers, but any coolant can be used. Silane is stored in the rundown tanks at 18.3 kg/cm$^2$ and −39° C. Transfer of silane from the rundown tank to a storage tank takes place by pressure differential. The rundown tank is initially at 18.3 kg/cm$^2$ whereas the storage tanks are at about 4.57 kg/cm$^2$.

Liquid silane flows out of the rundown tank through a dip leg. As the level in rundown tank drops, its pressure continues to drop to about 9.84 kg/cm$^2$ at the end of transfer. The pressure in the storage tanks is allowed to rise to about 5.98 kg/cm$^2$ during the transfer. This provides a heat sink for the warm silane entering the storage tanks. Silane liquid leaves the silane storage tanks and is vaporized using refrigerated heptane. The vaporized silane is warmed to within 7-12° C. less than ambient temperature in an atmospheric, fan-driven, finned-tube heater. The fan blows air over the heater tubes and improves the heat transfer coefficient. Silane from the finned-tube heater flows back into to the Siemens reactors [5].

The silane storage tanks are protected from overpressure by a pressure safety valve, which relieves to the flare. The worst condition for the silane storage tanks arises from accidental overfilling with silane from a rundown tank. When relieved to the flare, liquid silane will flash and cool the flare header. Since the normal boiling point of silane is −112° C., it must be heated above −28.9° C. before it can enter the carbon steel flare header. Heat is provided by a steam-heated multi-tube hairpin heat exchanger installed in the flare line leaving the silane storage tanks.

A separated hydrogen gas stream exits from the top of the knockout drum [13] and flows up through an optional demister (not separately depicted) and passes through adsorption beds preferably, operating in series [not shown]. In preferred embodiments, adsorption beds are carbon beds. Impurities in the hydrogen gas such as argon, carbon compounds (mainly methane), uncondensed silane, boron and phosphorous compounds are typically retained in the first carbon bed.

The adsorption beds are generally regenerated (using pressure and temperature swings methods) with the time between regenerations influenced by silane conversion in the reactor and the efficiency of the silane condensation in the exchangers. In a preferred embodiment, the regenerated column is lined up and brought back online downstream of the other columns so that a freshly regenerated column is the last column in the series and the last column to contact the recycle gas. When such a regeneration scheme is utilized, the secondary adsorption bed may then be taken off line and regenerated.

The purified hydrogen exiting the adsorption beds has a temperature between −170 and −175° C. and is then passed through a cryogenic filter [not shown] which has a gas rating of 1 micron absolute or lower, to trap any particulates from the adsorption beds to produce a filtered hydrogen stream. The filtered hydrogen stream is then heated to a temperature between 25 and 30° C. by passing through the tube-side of the interchangers [10]. A final filtration of the high purity hydrogen is achieved in the recycle hydrogen filter (not shown) which contains molecular seive elements rated at 0.1-0.04 microns. This second filtered and purified hydrogen stream is recycled back to the reactor [5].

The hydrogen supply system is the hydrogen source which supplies hydrogen to the reactors [5] in the event of a recycle compressor shutdown or as make-up hydrogen during times when leakage losses in the recycle loop occur. The hydrogen supply system is designed to provide enough time to restore compressor operation or to shutdown the reactors orderly when compressor operation is disrupted.

Figure 2:
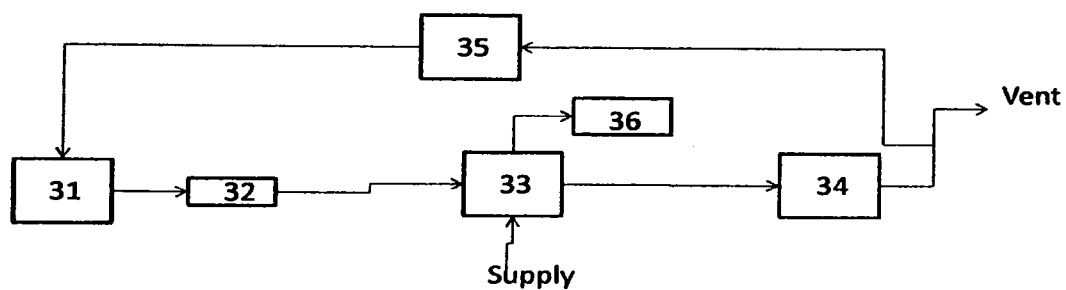
FIG. 2 is a schematic depicting a heat transfer fluid recirculation system useful in some embodiments of the invention.

The typical heat transfer fluid system (FIG. 2) provides heat to the CVD polysilicon rods pre-heating at the same time they maintain the temperature on the jacket via recirculation. Table 2 lists the components described in FIG. 2. This also provides heat to preheat the silane and hydrogen to the supply temperature. The heat transfer fluid is transferred from storage drum [33]. The heat transfer fluid used here was Syltherm 800 (a highly stable, long-lasting silicone heat transfer fluid) manufactured by DOW chemical, but any equivalent fluid can be used.

TABLE 2

| 31 | Heat Exchanger |
|---|---|
| 32 | Filter |
| 33 | Heating Medium Storage |
| 34 | Reactor Exchanger |
| 35 | Gas Preheater |
| 36 | Vent Cooler |

The storage drum is equipped with the vent cooler [36] to knock back the oil vapors back to the storage drum. The oil is pumped to the reactor jackets [34] where inlet temperature is maintained around 270° C. and the outlet temperature is maintained to not exceed 330° C. by means of circulation and heat exchange [31]. The heat exchanger [31] will kick-in whenever temperature exceeds the set limit. The heat transfer fluid also maintains the temperature to the feed gas in the pre-heater [35]. The beauty of the system is that it is self sufficient with energy (no supply of heat is needed) and excess usable energy is removed from the system if necessary.

A typical cooling system (nitrogen) for silane impurities separation is shown in FIG. 3. Table 3 below provides names for the components of the system shown in FIG. 3. The liquid nitrogen may be flowed through the cryogenic filter [22] to gas filter [23] and then to the silane condenser [24] for separation of hydrogen and condensable gas. In some embodiments of the invention, the liquid nitrogen is used for cooling and flowed through the recycle hydrogen cooler (not shown) and hydrogen regeneration cooler [26] as a cooling medium. The nitrogen off gas is then warmed and discharged to the vent, first passing through vent heater [28] or recycled to compressor [27].

TABLE 3

| 21 | Liquid Nitrogen storage |
|---|---|
| 22 | Filter |
| 23 | Gas Filter |
| 24 | Silane Condenser |
| 25 | Recycle Hydrogen Cooler |
| 26 | Hydrogen Regeneration Cooler |
| 27 | Compressor |
| 28 | Vent Heater |

We claim:

1. An improved CVD reactor system, said improvement comprising a monosilane and hydrogen recovery and recycle system including monosilane and hydrogen sources, wherein: i) hot reactor gas, comprising unreacted monosilane, hydrogen and impurities, from a CVD reactor is cooled and purified by filtration, absorption and fractional distillation to produce purified monosilane, a separate hydrogen stream and separate impurities; ii) said separate hydrogen stream is further cooled and purified to produce a cooled, purified hydrogen stream; iii) wherein a countercurrent heat exchanger between said cooled, purified hydrogen stream and said hot reactor gas cools the hot reactor gas from the CVD reactor; iv) said purified monosilane is compressed with a first compressor and fed back into said CVD reactor; v) wherein said purified hydrogen stream is compressed with a second compressor and fed back into said CVD reactor after being used in said countercurrent heat exchanger.

2. The improved CVD reactor system of claim 1, wherein said first or second compressor is a two-stage, non-lubricated, balanced-opposed, reciprocating compressor.

3. The improved CVD reactor system of claim 1, wherein the hot reactor gas is cooled to −170° C. to −180° C. to condense the monosilane and impurities, and said condensed monosilane is recycled into the CVD reactor or further purified.

4. The improved CVD reactor system of claim 3, wherein said condensed silane is passed through a degasser column to remove the light weight impurities and then through a heavy component purification column to remove heavy weight impurities and produce mono silane vapor.

5. The improved CVD reactor system of claim 4, wherein the degasser column is packed with structured packing material.

6. The improved CVD reactor system of claim 4, wherein said monosilane vapor is passed through one or more absorber columns containing 4 Å molecular sieves to remove ethylene.

7. The improved CVD reactor system of claim 6, wherein said absorber columns are operated in series.

8. The improved CVD reactor system of claim 6, wherein monosilane emerging from said adsorption columns is optionally filtered, and then passed to a finishing column to distill ethylsilane away from purified monosilane silane.

9. The improved CVD reactor system of claim 8, wherein purified monosilane is stored as liquid and then heated and recycled or recycled immediately.

10. The improved CVD reactor system of claim 9, wherein greater than 99.5% of the monosilane is reacted in the CVD reactor.

11. The improved CVD reactor system of claim 9, wherein 100% of the monosilane is reacted in the CVD reactor.

* * * * *